Figure 1:
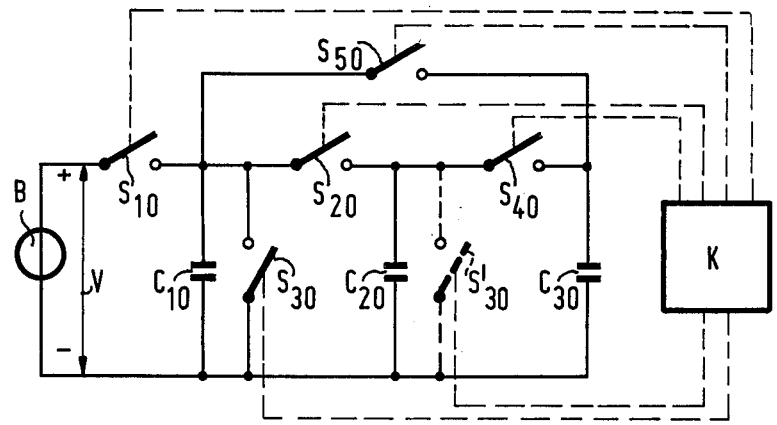

United States Patent [19]

Meijer Cluwen

[11] Patent Number: 4,471,482
[45] Date of Patent: Sep. 11, 1984

[54] SWITCHED CAPACITOR CIRCUIT FOR GENERATING A GEOMETRIC SEQUENCE OF ELECTRIC CHARGES

[75] Inventor: Johannes Meijer Cluwen, Eindhoven, Netherlands

[73] Assignee: U.S. Philips Corporation, New York, N.Y.

[21] Appl. No.: 308,964

[22] Filed: Oct. 6, 1981

[30] Foreign Application Priority Data

Oct. 20, 1980 [NL] Netherlands .................. 8005756

[51] Int. Cl.³ ............... H03K 4/02; H03K 17/00
[52] U.S. Cl. .................... 307/240; 307/246; 307/492
[58] Field of Search ............ 307/246, 227, 260, 261, 307/352, 353, 240, 492, 501; 328/186, 151; 340/347 AD; 357/23 C, 49

[56] References Cited

U.S. PATENT DOCUMENTS

| | | | |
|---|---|---|---|
| 3,638,039 | 1/1972 | Chen et al. | 307/246 X |
| 3,653,030 | 3/1972 | Carbrey | 340/347 AD |
| 4,072,938 | 2/1978 | Buchanan | 340/347 AD |
| 4,261,772 | 4/1981 | Lane | 357/23 C X |
| 4,325,055 | 4/1982 | Colardelle et al. | 340/347 AD |

Primary Examiner—Larry N. Anagnos
Assistant Examiner—David R. Hudspeth
Attorney, Agent, or Firm—Robert T. Mayer; Bernard Franzblau

[57] ABSTRACT

A device for generating a geometric sequence of values of an electrical quantity (charge or voltage) with the aid of switched capacitances. A switch control means operates a plurality of switches in a predetermined time pattern so as to distribute electric charges on a plurality of capacitors. A geometric sequence of electric charges is thus stored on the capacitors in which, first-order errors caused by inaccuracies in the capacitance values of the capacitors are eliminated. Furthermore, methods are proposed to minimize the influence of inevitable stray capacitances in the arrangement.

7 Claims, 4 Drawing Figures

SWITCHED CAPACITOR CIRCUIT FOR GENERATING A GEOMETRIC SEQUENCE OF ELECTRIC CHARGES

The invention relates to an arrangement for generating a sequence of values of an electrical quantity, which values are proportioned as the terms of a geometric sequence, especially for use in digital-to-analog or analog-to-digital converters. This arrangement is provided with two input terminals, a series connection of a first switch and a first capacitor coupled between said input terminals, a series connection of a second switch and a second capacitor coupled between the electrodes of the first capacitor, and a third switch coupled between the electrodes of the first capacitor. As is known from U.S. Pat. No. 4,137,464, it is, for example, possible to use a voltage source of specific value V and to connect this source to a capacitor having a capacitance value C so that said capacitor will carry a charge Q equal to $Q=CV$. If subsequently the connection between the voltage source and said capacitor is interrupted and said capacitor is then connected in parallel with an exactly equal capacitor, the charge Q will be equally distributed between the two capacitors so that the charge on each of the capacitors will be $\frac{1}{2}$ Q. Since in practice two capacitors will never have exactly the same capacitance, this equal charge distribution is impracticable, so that the said method is not suitable for accurately generating the desired sequence of electric charges.

It is an object of the invention to provide an arrangement which enables a sequence of electric charges to be generated, whose magnitudes very accurately vary in accordance with a geometric sequence, without imposing extremely stringent requirements on the accuracy of the components used, specifically the capacitors.

To this end a first embodiment of the arrangement in accordance with the invention is characterized in that it is provided with control means for closing and opening the switches in accordance with a predetermined time pattern in order to temporarily connect the first capacitor in parallel with the second capacitor, in order to temporarily short-circuit the first capacitor and subsequently connect the first capacitor temporarily in parallel with the second capacitor. In order to obtain such a time pattern, it is advantageous if the central means of the arrangement in accordance with the invention is are adapted to initially close the first switch for specific time and subsequently perform at least one switching cycle which comprises the successive closure of the second and the third switch during time intervals which do not overlap each other.

In order to extend the possibilities of the charge division arrangement in accordance with the invention a preferred embodiment of the arrangement in accordance with the invention is characterized in that it is provided with a series connection of a fourth switch and a third capacitor coupled between the electrodes of the second capacitor, as well as a fifth switch between the junction point of the fourth switch and the third capacitor and the junction point of the first switch and the first capacitor, a sixth switch being coupled between the electrodes of the second capacitor.

In order to obtain a switching cycle which is suitable for this circuit it is advantageous if the central means of the arrangement in accordance with the invention is adapted to initially close the first switch for a specific time and subsequently perform a switching cycle at least one time, which cycle comprises the successive closure of the second switch, the third switch together with the fourth switch, and subsequently the fifth switch together with the sixth switch for predetermined non-overlapping time intervals.

A second embodiment of the device in accordance with the invention is characterized in that it is provided with an input terminal, a common terminal and a ladder of capacitor sections, each capacitor section comprising a plurality of (suitably 2) capacitors, which with the aid of electronic switches controlled by clock signals are alternatively connected in series and in parallel. If the capacitors of a section are connected in parallel the capacitors of the next section are connected in series, which series connection is connected in parallel with at least one, suitably in parallel with all, parallel-connected capacitors of the preceding section.

When realizing the charge-division arrangement in accordance with the invention stray capacitances will be inevitable and especially in integrated embodiments they will have an influence which cannot to be ignored. In order to eliminate the influence of the principal stray capacitances it may be advantageous if the charge-division arrangement in accordance with the invention is characterized in that in at least one section the one electrode of one of the capacitors is connected to the common terminal, while the one electrodes of the further capacitors of said section, during the time that the capacitors of this section are connected in parallel, are connected to the common terminal via electronic switches. The last-mentioned one electrodes exhibit stray capacitances and means are provided for charging at least one of said stray capacitances, each time before the capacitors of said section are connected in series, to a potential corresponding to the potential which when the capacitors of said section are connected in series would appear on the one electrode of the capacitor corresponding to the stray capacitance, if no stray capacitances at all would be present.

With respect to the pre-charging of the stray capacitances of the first section, it is advantageous that in the charge division arrangement in accordance with the invention said charging means comprise at least one auxiliary capacitance, which by means of a seventh switch is connected to the input terminal and by means of an eighth switch can be connected in parallel with a stray capacitance of the section which is coupled to the input terminal.

In order to pre-charge the stray capacitances of the other sections as well, it is advantageous that in the charge-division arrangement in accordance with the invention said means comprise further switches which couple corresponding stray capacitances of adjacent sections to each other.

In the case of integration of the charge division arrangement in accordance with the invention on, for example, a silicon substrate, it may be advantageous to minimize the stray capacitances between the capacitors and the substrates.

To this end the charge division arrangement in accordance with the invention is characterized in that it is integrated in a semiconductor body, at least the capacitors of each section which exhibit a stray capacitance having an adverse effect on the operation of the arrangement being formed on top of a part of a comparatively thick insulating oxide layer obtained by local oxidation.

In the case of integration of the invention it may be advantageous with respect to the capacitance ratios between the auxiliary capacitance and the stray capacitances that in the charge division arrangement, the dielectric of the auxiliary capacitance be constituted by a part of said comparatively thick insulating oxide layer.

Figure 2:
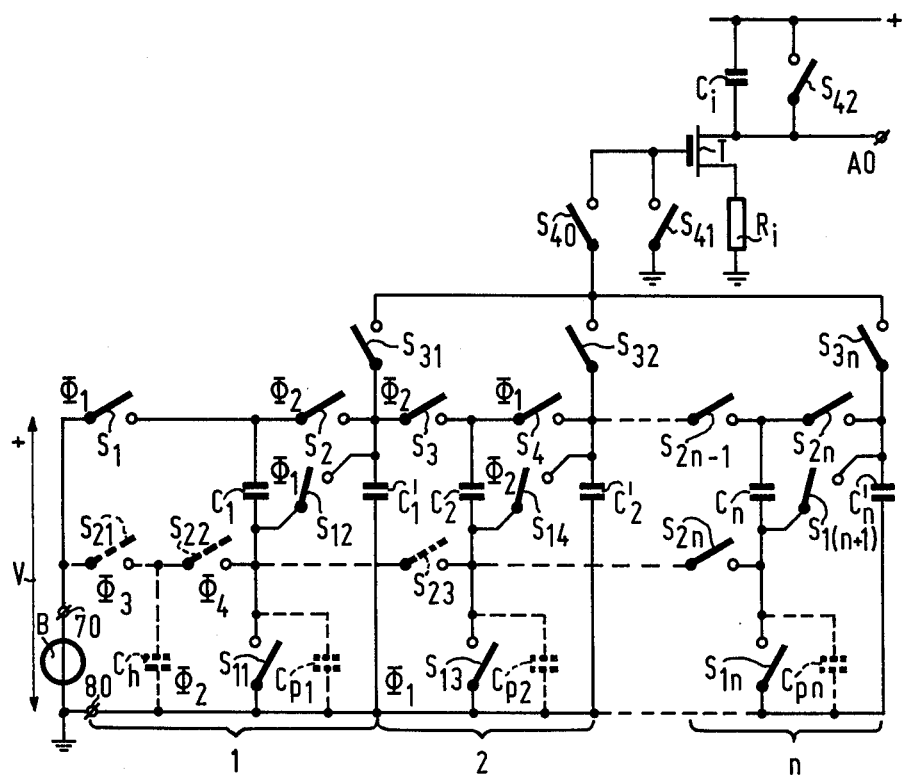
Figure 3:
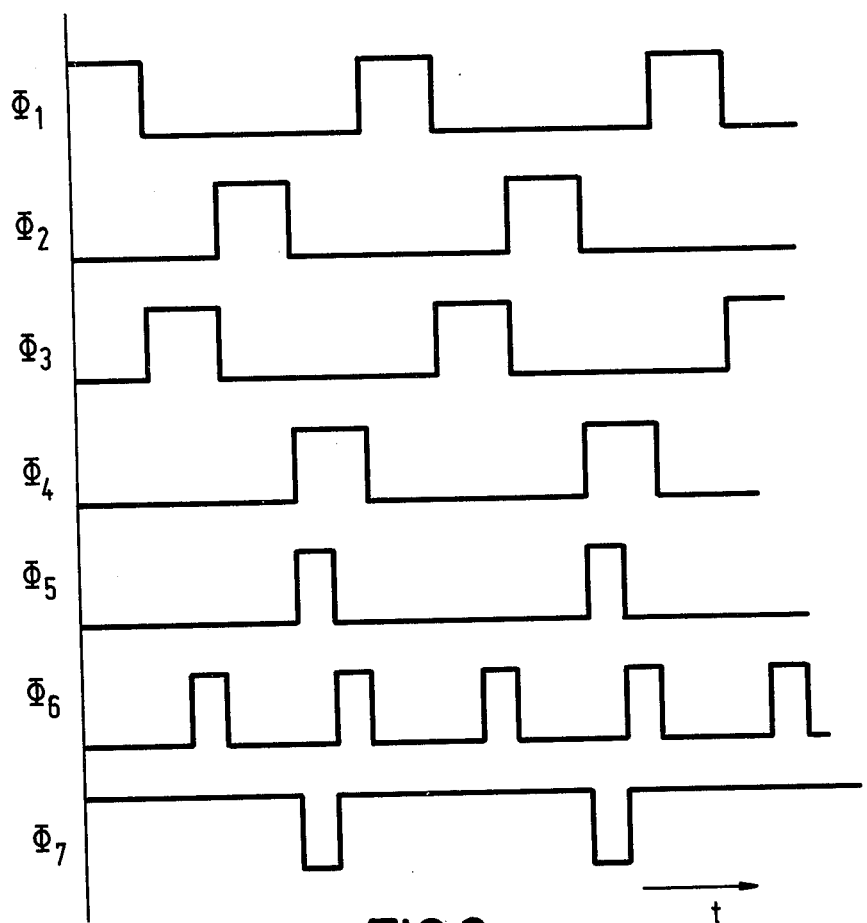
Figure 4:
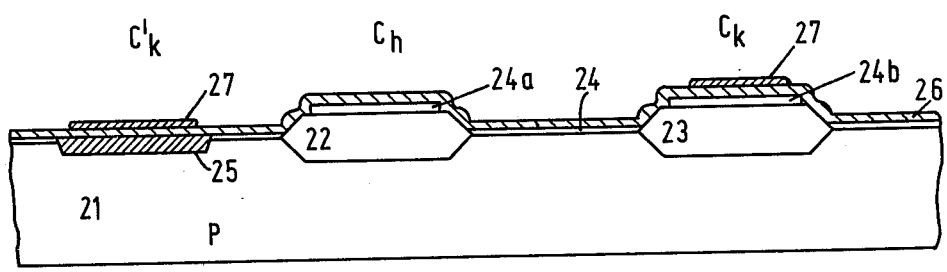

The invention will now be described in more detail with reference to the drawing, in which:

FIG. 1 represents a charge division arrangement in accordance with the invention employing a first charge division method, FIG. 2 represents an embodiment of a charge division arrangement in accordance with the invention using a second charge division method, FIG. 3 is a diagram of the various clock signals for controlling the circuit arrangement shown in FIG. 2 and, FIG. 4 is a sectional view through a semiconductor body in which some components of the circuit arrangement of FIG. 2 are integrated.

FIG. 1 shows an embodiment of a charge division arrangement in accordance with the invention comprising three capacitors $C_{10}$, $C_{20}$ and $C_{30}$, five switches $S_{10}$, $S_{20}$, $S_{30}$, $S_{40}$ and $S_{50}$ and the reference voltage source B supplying a voltage V. This circuit arrangement operates as follows: First of all switch $S_{10}$ is closed, while the other switches are open. Capacitor $C_{10}$, whose capacitance value is assumed to be C, is then charged to a voltage of V volts by the source B via switch $S_{10}$. Thus, the charge on capacitor $C_{10}$ is $Q = CV$ coulombs. Subsequently switch $S_{10}$ is opened and switch $S_{20}$ is closed so that capacitor $C_{10}$ is connected in parallel with capacitor $C_{20}$. The capacitance of $C_{20}$ is assumed to be equal to $C(1+2x)$, in which x is small relative to 1. Assuming that the charge on capacitor $C_{20}$ was previously equal to zero and ignoring second and higher order terms, the charge on capacitor $C_{10}$ will decrease to $\frac{1}{2}Q(1-x)$, while that on capacitor $C_{20}$ increases to $\frac{1}{2}Q(1+x)$. Switch $S_{20}$ is now opened and switch $S_{30}$ is temporarily closed so that the charge on capacitor $C_{10}$ is dissipated. Subsequently, capacitors $C_{10}$ and $C_{20}$ are again connected in parallel by closing switch $S_{20}$. The charge $\frac{1}{2}Q(1+x)$ on capacitor $C_{20}$ is then distributed so that:

$$CV' + C(1+2x)V' = \tfrac{1}{2}Q(1+x), \qquad (1)$$

where V' is the voltage ultimately obtained across the parallel connection of the capacitors $C_{10}$ and $C_{20}$. It follows from formula (1) that the charge on capacitor $C_{10}$ becomes equal to:

$$Q' = CV' = \tfrac{1}{4}Q \qquad (2)$$

that is a quarter of the original charge, the first-order error being eliminated by the process. This process can be continued by repeating the switching cycle from the instant at which switch $S_{20}$ is closed for the first time. In this way a series of charge values can be generated in accordance with the sequence $\tfrac{1}{4}Q$, $1/16Q$, $1/64Q$ etc.

Another possibility is to close switch $S_{40}$ at the instant at which capacitor $C_{20}$ is charged for the first time, that is after switch $S_{20}$ has been closed for the first time, and thus connect capacitor $C_{30}$ having the capacitance value $C(1+2y)$, where $y<1$, in parallel with capacitor $C_{20}$. The charge $\tfrac{1}{2}Q(1+x)$ is now distributed among capacitors $C_{20}$ and $C_{30}$ in such a way that:

$$C(1+2x)V'' + C(1+2y)V'' = \tfrac{1}{2}Q(1+x) \qquad (3)$$

where V" is the voltage ultimately obtained across the parallel connection of the two capacitors $C_{20}$ and $C_{30}$. It follows from formula (3) that the charge on capacitor $C_{30}$ after this charge distribution is $$Q'' = C(1+2y)V'' = \frac{1+y}{4}Q \qquad (4)$$

in which derivation second-order terms are ignored.

If in the meantime the charge on capacitor $C_{10}$ is dissipated and switch $S_{50}$ is closed, then:

$$CV''' + C(1+2y)V''' = \frac{1+y}{4}Q \qquad (5)$$

so that capacitor $C_{10}$ will receive the charge $$Q''' = CV''' = \tfrac{1}{8}Q \qquad (6)$$

in which the first-order error is again eliminated by the process.

This process may be repeated several times so that the relative error in the result of the repeated charge division may increase relative to the desired value, but its influence on the ultimate analog signal decreases.

The resulting charges, each weighted with the bit of corresponding weight of the digital input signal, can be transferred to an output, where the analog output signal is available after integration, by means of charge transfer devices (CTD's) such as bucket brigades (BB's) or charge-coupled devices (CCD's).

The circuit of FIG. 2 comprises a ladder of capacitors connected by electronic switches, each section of the ladder comprising a plurality (2 in the present example) of capacitors. During the clock phase $\phi_1$, in which the associated electronic switches are closed, the voltage source B is connected to the series connection of the capacitors $C_1$ and $C_1'$ of the first section (1). Assuming that said capacitors are substantially identical, each of said capacitors will consequently carry half the voltage, $\tfrac{1}{2}V$. During the clock phase $\phi_2$ the two capacitors $C_1$ and $C_1'$ of section 1 are now connected in parallel so that any inequality between the voltages across these capacitors is eliminated. Moreover, during said clock phase $\phi_2$ capacitors $C_1$ and $C_1'$ of section 1 are connected to the series connection of the capacitors $C_2$ and $C_2'$ of section 2. If all capacitors have the same capacitance values the voltage consequently decreases from $\tfrac{1}{2}V$ to $2/5V$, but during each subsequent clock phase $\phi_1$ the voltage level of $\tfrac{1}{2}V$ across capacitors $C_1$ and $C_1'$ of the first section is restored again.

The limit value to which the voltage across each of the capacitors of section 2 approximates after a number of clock periods is $\tfrac{1}{4}V$, for section 3 this limit value is $\tfrac{1}{8}V$ etc., which limit value in practice is reached soon after the clock pulses $\phi_1$ and $\phi_2$ have closed and opened the associated electronic switches a few times. Mutual equality of the capacitors of each section is only of secondary importance. Equality of the capacitors of different sections is even of less importance.

In the foregoing it is assumed that the influence of stray capacitances may be ignored. When discrete elements are used this requirement can easily be met, but when the arrangement it developed as an integrated circuit, the influence of stray capacitances cannot be ignored. If section 1 of the circuit of FIG. 2 is considered, the capacitance $C_{p1}$ of the connecting path between the lower end of the capacitor $C_1$ and the upper end of the capacitor $C_1'$ to ground plays an important part. When capacitors $C_1$ and $C_140$ are connected in parallel this capacitance $C_{p1}$ is short-circuited. When capacitors $C_1$ and $C_140$ are subsequently connected in series during the next clock phase, the stray capacitance $C_{p1}$ is suddenly connected in parallel with capacitor $C_1'$ so that charge is withdrawn from said capacitor $C_1'$. When it is assumed that capacitors $C_1$ and $C_1'$ carry exactly the desired voltage (for example exactly $\frac{1}{2}V$) the withdrawal of charge by the stray capacitance $C_{p1}$ will cause the voltage across $C_1'$ to decrease slightly and that across $C_1$ to increase slightly.

The charge stored in the capacitance $C_{p1}$ is lost when capacitors $C_1$ and $C_1'$ are connected in parallel via switch $S_{11}$, which obviously introduces an additional error.

Obviously, this also applies to all the other sections. Said undesired effect can be reduced substantially by charging the capacitance $C_{p1}$ to the desired voltage level ($\frac{1}{2}V$ in the present case) in a time interval between the clock phases $\phi_2$ and $\phi_1$, namely after the instant at which the switch $S_{11}$ is opened and prior to the instant at which the switch $S_{12}$ is closed.

The simplest method of realizing this is to provide an auxiliary capacitance $C_h$ of substantially equal capacitance value to the stray capacitance $C_{p1}$. Said capacitance $C_h$ is for example charged to a voltage V during clock phase $\phi_3$ (see FIG. 3) and subsequently, during a clock phase $\phi_4$ (see FIG. 3), which occurs after the clock phase $\phi_2$ but prior to the next clock phase $\phi_1$, is connected in parallel with the stray capacitance $C_{p1}$ so that this capacitance is charged to a voltage $\frac{1}{2}V$. In the next clock phase $\phi_1$ the charging current (of the series connection of the capacitors $C_1$ and $C_1'$) to the capacitance $C_{p1}$ is reduced to substantially zero. In a similar way the charge on the stray capacitance $C_{pi}$ may be distributed among this capacitance and the next stray capacitance $C_{p2}$ by closing the switch $S_{23}$, so that said capacitances will carry a voltage $\frac{1}{4}V$, assuming that they are equal. In the subsequent clock phase $\phi_2$ no charging current is then required for the stray capacitance $C_{p2}$, so that the influence of said error source is eliminated.

If it is not impossible to keep the values of the stray capacitances $C_{p1}$, $C_{p2}$ etc. and the auxiliary capacitance $C_h$ sufficiently under control, one may revert to the charge division means described with reference to FIG. 1. The stray capacitance $C_{p2}$ may then for example be connected to the voltage source B during a clock phase $\phi_5$ (clock phases $\phi_3$ and $\phi_4$ are assumed to be absent) and subsequently during a clock phase $\phi_6$ connected in parallel with an auxiliary capacitance of substantially equal magnitude (not shown). Subsequently, the capacitance $C_{p2}$ is discharged during a clock phase $\phi_1$, after which the clock pulse $\phi_6$ again establishes a connection to said auxiliary capacitance, so that after this the voltage across the capacitance $C_{p2}$ will be $\frac{1}{4}V$ when ignoring second-order errors, as already explained with reference to FIG. 1. In a similar way, the other stray capacitances in the ladder could also be precharged to the required voltage level. Since the influence of deviations of these stray capacitances on the ultimate analog output signal constantly decreases, it generally suffices to adopt the method with the clock pulses $\phi_3$ and $\phi_4$ already described with reference to FIG. 2 (whose timing should then be adapted, for example $\phi_3$ after $\phi_5$ and $\phi_6$, but before $\phi_1$ etc.) for these capacitances.

The method described in the foregoing of precharging the stray capacitances to the required voltage does not apply to the capacitance $C_{p1}$, which has the greatest influence on the analog output signal of all the stray capacitances. However, this problem may largely be remedied by the use of a similar series-parallel connection as for the capacitors $C_1$-$C_1'$ in FIG. 2. The lower end of the auxiliary capacitor $C_h$ is then not connected directly to ground but via a first electronic switch, while the second electronic switch is included between the lower end of the auxiliary capacitor $C_h$ and the upper end of the parasitic capacitance $C_{p1}$.

During the clock phase $\phi_5$ (see FIG. 3), which occurs after $\phi_2$ but before $\phi_1$, the series connection of $C_h$ and $C_{p1}$ can then be charged from the voltage source B, so that each of these capacitances carries a voltage of approximately $\frac{1}{2}V$; after which during the clock phase $\phi_7$ the capacitances $C_h$ and $C_{p1}$ are connected in parallel. Clock pulse $\phi_7$ may appear during the clock phase $\phi_1$. However, during the clock phase $\phi_2$ it must be present because when $C_{p1}$ is discharged $C_h$ should also be discharged. Thus, the inverse of $\phi_5$ may be selected for $\phi_7$.

In principle the circuit arrangement of FIG. 2 may also be equipped with more than two capacitors per section, which should then also be alternately connected in series and in parallel by means of electronic switches. Owing to the substantial influence of the stray capacitances on the final result, and the limited need in the case of ADC's and DAC's for a sequence of voltage values which are proportioned as the terms of a geometric sequence with a ratio smaller than $\frac{1}{2}$, two capacitors will be preferred.

In order to obtain an analog output signal value as a function of a digital input signal, the connections of all capacitors $C_k$ and $C_k'$ (where $1 \leq k \leq n$) to ground would have to be interrupted by means of electronic switches. If, depending on the digital input signal, the voltage generated in the $k^{th}$ section should be allowed for in obtaining the analog output signal, the connecting switch between the lower end of the capacitor $C_k$ and the upper end of the capacitor $C_k$ is closed. If this voltage should not be taken into account, the electronic switch connects the upper ends of the capacitances $C_k$ and $C_k'$ is closed. If for example, bit 1 is to be included, while bit 2 is not, the electronic switches between the lower end of $C_1$ and the upper end of $C_1'$, between the upper ends of $C_1'$ and $C_2$ and between the upper ends of $C_2$ and $C_2'$ are closed.

FIG. 2 also represents a solution which is based on the successive scanning of the voltages across the capacitors $C_n'$. The scanned voltage values, each weighted with the bit of corresponding weight of the digital input signal, are summed in an integrating amplifier comprising a MOS transistor T, a capacitor $C_i$ and a resistor $R_i$. Suitably, the capacitors $C_k$ and $C_k'$ of each section should then be connected in parallel. Successively the switches $S_{31}$, $S_{32}$ and $S_{3n}$ are closed temporarily. Actual scanning is effected by closing the switch $S_{40}$ during constant scanning intervals. After each scanning interval switch $S_{41}$ is temporarily closed in order to allow the gate electrode of the MOS-transistor T to discharge. During scanning, as stated previously, those value whose bit of corresponding weight in the digital input signal is equal to 0 are skipped. Before the beginning of a scanning cycle capacitor $C_i$ is discharged by temporarily closing switch $S_{42}$.

For generating a digital output signal as a function of an analog input signal the signal produced on output AO may be compared, in known manner, with the analog input signal and depending on the result of this comparison the switches S$_{31}$, S$_{32}$ and S$_{3n}$ respectively may be closed or not.

FIG. 4 shows how the capacitors C$_k$ and C$_k'$ can be formed on a semiconductor body. Use is made of a semiconductor body 21 of for example lightly P-doped silicon.

The surface of this semiconductor body is covered with silicon nitride, in which subsequently holes are etched locally. At the locations of these holes the silicon is oxidized by bringing it to a high temperature in an oxygen rich atmosphere in a furnace. This process is known in the literature by the name LOCOS. Thus, the oxide zones 22 and 23 can be formed. Subsequently, the silicon nitride layer is etched away and the N-doped silicon layer 24 is grown, which is polycrystalline at the location of the oxide zones 22 and 23 and is monocrystalline elsewhere. A part of this layer is etched away such that on the oxide zones 22 and 23 islands of N-type silicon 24a and 24b are left, which function as one elctrode of the capacitance to be formed. Moreover a P-doped zone 25 is deposited in the semiconductor body 21, which zone serves as the one electrode of a capacitor of which one electrode is connected to ground. Subsequently, a thin insulating layer 26, preferably silicon nitride, is deposited onto the body, for example by vapour deposition and subsequently the metal electrodes 27 are deposited.

The zone 24b and the associated metal electrode 27 together with the dielectric constituted by the insulating layer 26 form one of the capacitors C$_k$ or C$_k'$ of FIG. 2. The zone 25 and the associated metal electrode 27 together with the dielectric 26 may constitute one of the capacitors C$_k'$ of FIG. 2.

In practice it is possible to control the thickness of the layer 26 and the surfaces of the zones 24b, 25 and 27 in such a way that capacitance deviation between the capacitors C$_k$ and C$_k'$ remain within 1%. As the zone 26 can be substantially thinner than the zone 23 and the dielectric constant of the layer 26 may for example be a factor of 3 higher than that of the zone 23, it is also possible to obtain a capacitance value which is substantially higher (for example more than 50 x) than that of the stray capacitance which the zone 24b exhibits relative to the semiconductor body 21. This body is connected to ground and said stray capacitance constitutes one of the capacitances C$_{p1}$, C$_{p2}$, . . . C$_{pn}$ of FIG. 2.

In order to realize the auxiliary capacitance C$_h$ of FIG. 2, the thick oxide layer 22 and the zone 24a are provided, which last-mentioned zone exhibits substantially the same capacitance relative to earth (body 21) as the zone 24b. Thus, it can be achieved that C$_h$ equals C$_{pk}$, where ($1 \leq k \leq n$), within a few percent and, because C$_{pk}$ may be some tens of times smaller than C$_k$ or C$_k'$ respectively, the influence of stray capacitances can be reduced to less than 0.1%.

Obviously, the other capacitors C$_k'$ are obtained by providing a multiplicity of the structure 23, 24b, 26, 27, and the further capacitors C$_k'$ either as C$_k$, or by means of a multiplicity of the structures 25, 26, 27. As electronic switches use is preferably made of insulated-gate field-effect transistors (IGFET's), which may be realized by means of the integration steps with which the zones and electrodes 25, 26, 27 are formed. Specifically, the zone 26 may serve as the insulating zone between the gate electrode and the channel of such an IGFET.

What is claimed is:

1. A switched capacitor circuit for generating a geometric sequence of electrical charges for use in digital-to-analog or analog-to-digital converters, said circuit comprising: two input terminals, a series connection of a first switch and a first capacitor coupled between said input terminals, a series connection of a second switch and a second capacitor coupled between the electrodes of the first capacitor, a third switch coupled between the electrodes of the first capacitor, a series arrangement of a fourth switch and a third capacitor coupled between the electrodes of the second capacitor, a fifth switch coupled between a junction point of the fourth switch and the third capacitor and a junction point of the first switch and the first capacitor, a sixth switch coupled between the electrodes of the second capacitor, and control means for closing and opening the switches in accordance with a predetermined time pattern, characterized by initially closing the first switch for a specific time and subsequently performing a switching cycle at least one time, said cycle comprising the consecutive closure of the second switch, the third switch together with the fourth switch, and subsequently the fifth switch together with the sixth switch for predetermined non-overlapping time intervals, wherein said geometric sequence is generated by charge sharing between said first through third capacitors.

2. A switched capacitor circuit for generating a geometric sequence of electrical charges for use in analog-to-digital or digital-to-analog converters, said circuit comprising: an input terminal, a common terminal and a ladder of capacitor sections (1, 2 . . . n respectively connected to said input and common terminals, each capacitor section comprising at least two capacitors (C$_1$, C$_1'$; C$_2$, C$_2'$ . . . C$_n$, C$_n'$), means including a plurality of electronic switches (S$_1$, S$_2$ . . . S$_{2n}$ respectively; S$_{11}$, S$_{12}$, S$_{13}$, S$_{14}$ . . . S$_{1n}$, S1n+1 respectively) controlled by clock signals ($\phi_1$, $\phi_2$) for alternately connecting the capacitors in series and parallel so that when the capacitors (C$_1$, C$_1'$) of a section (1) are connected in parallel the capacitors (C$_2$, C$_2'$) of the next section (2) are connected in a series connection that is in parallel with at least one of the parallel-connected capacitors (C$_1$, C$_1'$) of the preceding section (1), wherein said geometric sequence is generated by charge sharing between said capacitor sections.

3. A circuit as claimed in claim 2, characterized in that in at least one capacitor section one electrode of one of the capacitors (C$_1'$, C$_2'$ . . . C$_n'$) is connected to the common terminal (80), one electrode of the other capacitors (C$_1$, C$_2$ . . . C$_n$ respectively) of said section, during the time that the capacitors of said section are connected in parallel, being connected to the common terminal (80) via electronic switches (S$_{11}$, S$_{13}$ . . . S$_{1n}$ respectively), the one electrode of said other capacitors exhibiting stray capacitances (C$_{p1}$, C$_{p2}$ . . . C$_{pn}$ respectively), and means for charging at least one of said stray capacitances (C$_{p1}$, C$_{p2}$ . . . C$_{pn}$), each time before the capacitors of said section (1, 2 . . . n respectively) are connected in series to a potential corresponding to the potential which, when the capacitors of said section (1, 2 . . . n respectively) are connected in series would appear on the one electrode of the capacitor corresponding to the stray capacitance, if no stray capacitances at all would be present.

4. A circuit as claimed in claim 3, characterized in that said charging means comprise at least one auxiliary capacitance (C$_h$) coupled by means of a seventh switch (S$_{21}$) to the input terminal (70) and by means of an eighth switch ($S_{22}$) can be connected in parallel with a stray capacitance ($C_{p1}$) of the capacitor section (1) which is coupled to the input terminal.

5. A circuit as claimed in claim 4, characterized in that said charging means comprise further switches ($S_{23}$ ... $S_{2n}$), which couple corresponding stray capacitances ($C_{p1}$, $C_{p2}$ ... $C_{pn}$ respectively) of adjacent sections to each other.

6. A circuit as claimed in claim 2, 3, 4 or 5, characterized in that it is integrated in a semiconductor body at least the capacitors ($C_1$, $C_2$ ... $C_n$ respectively) of each section which exhibit a stray capacitance ($C_{p1}$, $C_{p2}$ ... $C_{pn}$ respectively) having an adverse effect on the operation of the circuit arrangement being formed on top of a part (23) of a comparatively thick insulating oxide layer obtained by local oxidation.

7. A circuit as claimed in claim 6, characterized in that the dielectric of the auxiliary capacitance is constituted by a part (22) of the comparatively thick oxide layer.

* * * * *

UNITED STATES PATENT AND TRADEMARK OFFICE
CERTIFICATE OF CORRECTION

PATENT NO. : 4,471,482
DATED : September 11, 1984
INVENTOR(S) : JOHANNES MEIJER CLUWEN It is certified that error appears in the above-identified patent and that said Letters Patent is hereby corrected as shown below:

In the Abstract:

Line 7, after "which" delete "," (comma)

In the Claims:

Claim 2, line 5, change "(1, 2 ... n respectively" to -- (1, 2 ... n respectively) --

Claim 6, line 2, after "body" insert --,-- (comma)

Signed and Sealed this

Eighth Day of October 1985

[SEAL]

Attest:

DONALD J. QUIGG

Attesting Officer

Commissioner of Patents and
Trademarks—Designate